United States Patent [19]

Bruel et al.

[11] Patent Number: 5,863,830
[45] Date of Patent: Jan. 26, 1999

[54] PROCESS FOR THE PRODUCTION OF A STRUCTURE HAVING A THIN SEMICONDUCTOR FILM ON A SUBSTRATE

[75] Inventors: Michel Bruel, Veurey; Thierry Poumeyrol, Noyarey, both of France

[73] Assignee: Commissariat a l'Energie Atomique, France

[21] Appl. No.: 529,927

[22] Filed: Sep. 18, 1995

[30] Foreign Application Priority Data

Sep. 22, 1994 [FR] France .................................... 94 11311

[51] Int. Cl.$^6$ .................................................. C30B 25/00
[52] U.S. Cl. .......................... 438/478; 438/479; 438/480
[58] Field of Search .................................. 438/478, 479, 438/480

[56] References Cited

U.S. PATENT DOCUMENTS

| 4,179,324 | 12/1979 | Kirkpatrick | 156/230 |
| 5,110,748 | 5/1992 | Sarma . | |
| 5,310,446 | 5/1994 | Konishi et al. | 117/58 |
| 5,374,564 | 12/1994 | Bruel | 437/24 |

FOREIGN PATENT DOCUMENTS

| 0355913 | 8/1989 | European Pat. Off. . |
| 0504714 | 3/1992 | European Pat. Off. . |

OTHER PUBLICATIONS

Japanese Journal of Applied Physics, vol. 23, No. 10, Oct. 1984 Tokyo, JP, pp. L815–L817, T. Hamguchi et al., Device Layer Transfer–Technique Using Chemi–Mechanical Polishing.

Proceedings of the fifteenth international symposium on gallium arsenide and related compounds, 1988, 1988 Bristol pp. 387–392, XP 000000001, J.F. Klem, et al., Characteristics of Lift–off Fabricated Algaas/ Ingaas, single–Strained, etc..

Japanese Journal of Applied Physics, Part I, 1989, Japan vol. 28, No. 8 ISSN 0021–4922, pp. 1426–1443, Haisma J. et al. Silicon–On–Insulator Wafer Bonding–Wafer Thinning Technological Evaluations.

*Primary Examiner*—Gary Geist
*Assistant Examiner*—J. Parsa
*Attorney, Agent, or Firm*—Cesari and McKenna, LLP

[57] ABSTRACT

A process for the production of a structure having a thin semiconductor film (2) adhering to a target substrate (24). The process which is applicable to the production of electronic components comprises the steps of a) producing a first structure having a thin semiconductor film (2) on a first substrate, and b) transferring of the thin film (2) from the first substrate to the target substrate.

14 Claims, 1 Drawing Sheet

PROCESS FOR THE PRODUCTION OF A STRUCTURE HAVING A THIN SEMICONDUCTOR FILM ON A SUBSTRATE

DESCRIPTION

1. Technical Field

The present invention relates to a process for the production of a structure having a thin semiconductor film on a substrate having an expansion coefficient identical to or different from that of the film. The invention is particularly applicable in the microelectronics field and more specifically for producing structures with a thin, monocrystalline silicon film on a quartz or glass substrate. Such structures are e.g. used for the production of active matrix flat screens.

2. Prior Art

During a transfer of a thin film to a substrate of a different nature to said film, the problem generally arises of a differential expansion due to different expansion coefficients. One example which illustrates this problem particularly well is that of the transfer of a monocrystalline silicon film to a glass or quartz substrate. The expansion coefficient of silicon is approximately 2.6 to 2.8 parts per million per degree celsius, whereas that of quartz is 0.2 to 0.5 ppm/°C. For glass, the expansion coefficient, which is in particular a function of its composition, is between that of silicon and that of quartz. The expansion difference between the film and the substrate leads to significant mechanical stresses.

The known processes for transferring a thin film, e.g. a monocrystalline silicon film to a quartz substrate generally involve the following stages:

adhesive contacting at ambient temperature of a monocrystalline silicon wafer with a quartz substrate, involving the cleaning and preparation of the surfaces by chemical treatments prior to surface contacting;

heat treatment at a low temperature between 50° and 70° C. in order to increase the bonding energy without generating excessive differential expansion stresses, which could lead to the fracture of the substrate or wafer, or to a separation;

mechanical, mechanicochemical or chemical abrasion of the silicon wafer so as only to leave a silicon film thickness of a few micrometers to a few dozen micrometers;

heat treatment at a slightly higher temperature of 100° C. in order to increase the adhesion of the film and as the silicon film has undergone a thickness reduction, the stresses exerted at the silicon-quartz interface are lower during this treatment;

finishing of the film by chemical or mechanicochemical polishing in order to attain the desired thickness;

high temperature heat treatment, e.g. 600° C. in order to complete the silicon-quartz bond.

Usually a succession of several abrasion and heat treatment stages is necessary. The abrasion stages make it possible to progressively reduce the thickness of the wafer. The heat treatments increase the bonding energy between the film and the substrate, but generate mechanical tensions due to the different expansions of the film and the substrate. By reducing the thickness of the film, abrasion improves its differential expansion behaviour.

The numerous successive stages, particularly the heat and abrasive treatments makes said transfer processes very complex and costly. Moreover, said treatments can deteriorate the quality of the finely obtained thin film.

Moreover, even when the substrate and thin film have an identical expansion coefficients, the formation of the film directly on the substrate can also give rise to problems and require the use of a transfer process. This is e.g. the case when the temperature used for producing the thin film exceeds the admissible temperature for the substrate.

An object of the present invention is to supply a transfer process not suffering from the complexity of known procedures and which leads to an excellent quality thin film transfer.

DESCRIPTION OF THE INVENTION

To avoid these difficulties, the invention relates to a process for the production of a structure having a semiconductor thin film adhering to a target substrate, characterized in that it has the following stages:

a) production of a first structure having a thin semiconductor film on a first substrate, the thin film having a first free face called the front face and a second face called the rear face bonded to the first substrate by a first bonding energy $E_0$, b) transfer of the thin film from the first substrate to the target substrate, said transfer involving both a tearing of the thin film from the first substrate by application to the thin film-first substrate assembly of tearing away forces able to overcome the first bonding energy and adhesive contacting of the thin film with the target substrate.

According to an aspect of the invention, stage b) of the process involves:

$b_1$) the adhesive contacting a manipulator with the first face of the thin film, the adhesive contact being established with a second bonding energy $E_1$ exceeding the first bonding energy, $b_2$) separation of the thin film and the first substrate by tearing away the thin film level with the second face and the first substrate, $b_3$) adhesive contacting of the second face of the thin film with the target substrate with a third bonding energy $E_2$ and separation of the thin film from the manipulator.

The term manipulator is understood to mean a support such as a substrate making it possible to maintain or hold the thin film, particularly during its separation from the first substrate. This support serves to mechanically grip the thin film and exert tearing away forces.

When the separation of the thin film from the manipulator is obtained by tearing away forces applied to the thin film-manipulator assembly, the third bonding energy $E_2$ exceeds the second bonding energy $E_1$.

According to a variant of the invention, stage b) of the process successively involves the direct adhesive contacting of the first face of the thin film with the target substrate using a bonding energy higher than the first bonding energy and then the tearing of the thin film from the first substrate.

As a result of the invention, the thin film can be produced directly on the first substrate, i.e. on a substrate having an expansion coefficient which is either identical or very close to that of the film. This can take place e.g. by known contacting treatments, e.g. by bonding wafers and mechanical or mechanicochemical abrasion. The problems of differential expansion do not exist in this case, the film thickness reduction treatments being greatly facilitated.

According to another embodiment, the film can be obtained by an implantation of ions of rare gas or hydrogen in a supplementary substrate through its surface. The implantation generates a layer of gaseous microbubbles extending substantially in accordance with a plane defining within the supplementary substrate a thin surface film. The depth of the implantation of the ions makes it possible to regulate the film thickness. The first substrate according to the invention is then adhesively contacted with a first bonding energy with the thin film. This is followed by a heat treatment, which by a crystalline rearrangement effect and by a pressure effect in the gaseous microbubbles gives rise to a cleaving, i.e. to the separation of the film from the remainder of the supplementary substrate.

Following the supply of the first substrate with the thin film, the free face of the film is brought into adhesive contact either directly with the target substrate or with a manipulator.

The manipulator can e.g. be a film or flexible sheet of organic material such as e.g. polyvinyl chloride. It is also possible to use an aluminium film.

The adhesive contact according to the process of the invention can take place by means of thermal treatment and/or pressure and/or chemical preparation of the surfaces to be contacted. It is also possible, in the particular case of the adhesive contact between the film and the manipulator, to use an adhesive, e.g. an acrylic or epoxy adhesive with which the manipulator is coated.

It is important that the bonding energy between the manipulator and the thin film exceeds the bonding energy between the thin film and the first substrate.

Another possibility for producing the adhesive contact between the manipulator and the thin film consists of using electrostatic forces between these two parts. An electric field is established between the thin semiconductor film and the manipulator. In this case the manipulator has a conductive film forming an electrode, which can be of an electricity conducting material such as aluminium.

An insulating film or coating are also provided on the surface of the conductive film in order to form the dielectric of a capacitor, whose armatures are the conductive film and the thin film. The application of a voltage between these two armatures creates a bonding energy between the thin film and the manipulator, which can be regulated by adjusting the electrostatic tension. The bonding forces can also be established or eliminated by simply applying or eliminating the tension.

When the manipulator has been firmly connected to the thin film, i.e. with a bonding energy $E_1$ exceeding the bonding energy $E_0$ between the substrate and the thin film, the tearing away separation stage can take place.

In general, in the invention, tearing away can be brought about by a tensile and/or a shearing force. The term tensile force and shearing force is understood to mean a resultant force. Thus, the tensile and/or shearing force can be unique or can be broken down into a plurality of forces, whose action is combined.

The adhesive contacting of the thin film with the target substrate and the separation of the film from the manipulator can take place in any order. The contacting of the thin film with the target substrate can take place before or after separation with the manipulator.

The order of the operations depends on the face of the thin film which is contacted with the target substrate. Through the invention it is possible to contact the target substrate either by its front face or by its rear face.

According to a first embodiment of the invention the rear face of the thin film, which is its free face when the latter is in contact with the manipulator, is adhesively contacted with one face of the target substrate. This adhesion is also obtained in known manner by using adhesive or by surface treatments and/or heat treatments and/or pressure, or by using electrostatic forces.

The manipulator is then separated from the thin film. Separation can take place under the effect of the tearing off forces, like the operation of separating the film from the first substrate. In this case it is important that the bonding energy $E_2$ between the thin film and the target substrate exceeds the bonding energy $E_1$ between the film and the manipulator.

When the adhesion between the manipulator and the film is obtained by electrostatic forces, separation simply takes place by eliminating the corresponding electrostatic tension. The separation of the film and the manipulator can also be obtained by dissolving the manipulator in a chemical bath.

According to another embodiment of the invention, the separation of the thin film from the manipulator takes place before contacting with the target substrate. The assembly formed by the manipulator and the thin film is then immersed in a chemical bath able to dissolve the manipulator. When the manipulator is made from aluminium, the bath can be hydrofluoric acid. If contact is brought about by epoxy resin adhesive, then the adhesive is dissolved e.g. with nitric acid.

When the manipulator is dissolved, the thin film floats to the surface of the bath. The film is collected on the target substrate which, after also having been immersed in the bath, is raised to the surface of the bath, e.g. with forceps.

This embodiment of the process makes it possible to collect the film on the target substrate, contacting with the latter either its front face or its rear face.

To facilitate the transfer of the film to the target substrate, the latter can be given a size greater than that of the film.

Other features and advantages of the invention can be gathered from the following description with reference to the attached drawings.

DETAILED DESCRIPTION OF EMBODIMENTS OF THE PROCESS OF THE INVENTION

Figure 1:
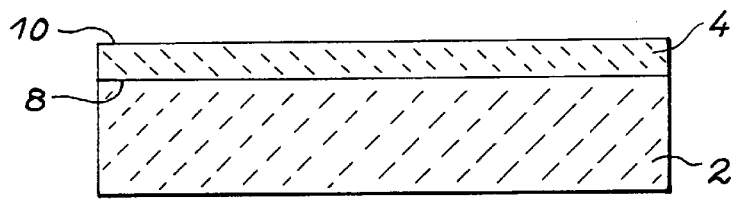
FIG. 1 is a diagrammatic section of a first substrate and a thin film in contact with said substrate.

FIG. 1 shows the starting structure consisting of a first substrate 2, e.g. of a semiconductor material, on which is formed a thin film 4, which preferably has a monocrystalline structure.

In known manner, the formation of the thin film can e.g. involve a bonding at ambient temperature of a silicon wafer to a substrate 2, a heat treatment to increase the bonding energy of the wafer with the substrate and then a thickness reduction by abrasion. These operations are simple to perform if the film and substrate are either of the same nature, or have essentially the same expansion coefficients.

According to the invention and a particular embodiment thereof, the thin film 4 can be defined by the implantation of rare gas or hydrogen ions at a certain depth in a supplementary substrate. Such an implantation generates in the supplementary substrate a thin layer of gaseous microbubbles, which defines the thin film and constitutes a cleaving "plane" for subsequently separating the thin film from the remainder of the supplementary substrate, when said film is in adhesive contact with the first substrate. Such a thin film formation process is e.g. described in French patent application 2681472.

Thus, the thin film has a rear face 8 in contact with the substrate 2 and a free, front face 10.

Figure 2:
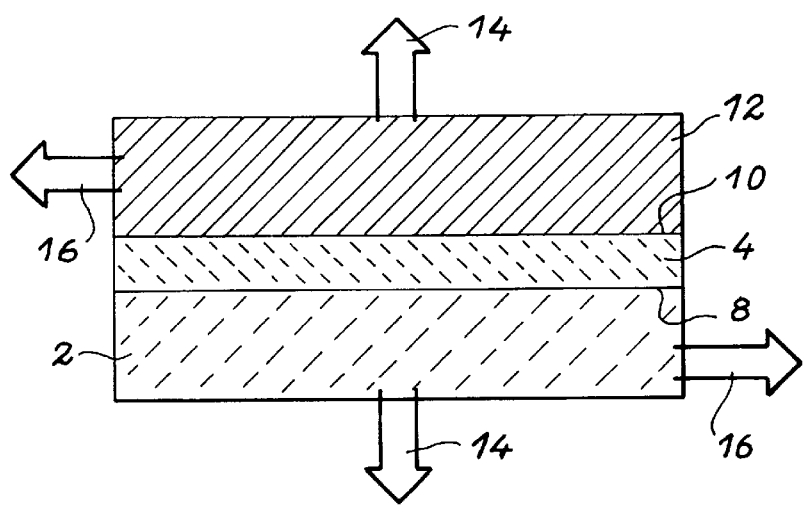
FIG. 2 is a diagrammatic section of the substrate, the thin film and a manipulator in contact with the film.

A manipulator 12, e.g. shown in FIG. 2, is e.g. an aluminium sheet coated with an epoxy resin adhesive or a polyvinyl chloride sheet coated with an acrylic adhesive and is bonded to the face 10 of the thin film with a bonding energy $E_1$ exceeding the bonding energy $E_0$ between the film and the substrate. The rear face 8 of the thin film is still in contact with the substrate.

Tensile and/or shearing forces, respectively represented by the arrows 14, 16 in FIG. 2, are applied to the manipulator and/or the substrate. The substrate can also be kept fixed when the forces are applied to the manipulator. The forces 14, 16 bring about a separation of the thin film and the substrate, the film remaining in contact with the manipulator 12, as shown in FIG. 3.

Figure 3:
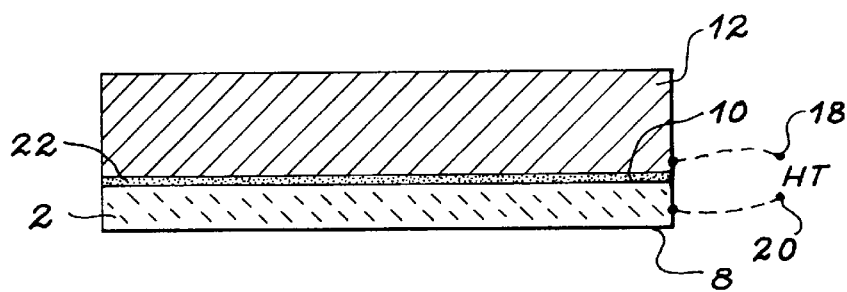
FIG. 3 is a diagrammatic section of the manipulator in contact with the thin film, which is separated from the first substrate.

FIG. 3 also very diagrammatically shows another way of contacting the thin film and the manipulator using electrostatic forces. The preferably metallic manipulator 12 is then connected to a first terminal 18 of a high voltage generator. The thin film 4 is connected to another terminal 20 of the generator. An insulating layer 22 is in this case formed on the manipulator surface in order to electrically insulate it from the film. The manipulator and thin film then respectively form the armatures of a capacitor and electrostatic forces keep them in contact when a voltage is applied between the terminals 18 and 20.

Figure 4:
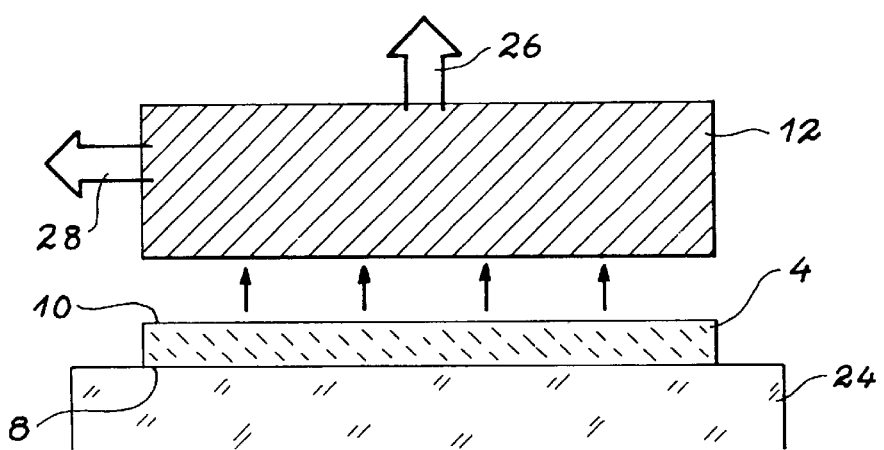
FIG. 4 is a diagrammatic section of the manipulator, the thin film and the target substrate to which has been transferred the film, the manipulator being separated from the film.

FIG. 4 shows the adhesive contacting of the thin film 4 with a target substrate 24 and the separation of the film 4 and the manipulator 12. Preferably the size of the target substrate 24 exceeds that of the film. For example, the target substrate is a pellet with a diameter of 12.5 cm, whereas the film has on one of its surfaces 10 or 8 a size of 10 cm.

The target substrate 24, e.g. a glass or quartz plate, has an expansion coefficient, which can be different from that of the film. Thus, adhesive contacting, e.g. by chemical treatment of the surfaces to be contacted, can take place at ambient temperature and expansion problems do not arise. It is also possible to continue this stage by a heat treatment to increase the bonding energy. As the thin film 4 has been formed or thickness reduced prior to the contacting with the target substrate, the heat treatment does not lead to excessive, differential expansion stresses. As the film 4 is thin its deformations follow those of the target substrate 24 on which it is deposited.

When the thin film 4 adheres to the target substrate 24, the manipulator is separated by exerting tensile and/or shear forces represented by arrows 26, 28. The forces 26, 28 like the forces 14, 16 in FIG. 2 can be exerted manually or mechanically.

During this operation, the bonding energy $E_2$ between the film 4 and the substrate 24 can exceed the bonding energy $E_1$ between film 4 and manipulator 12.

As described hereinbefore, the manipulator can also be separated from the film 4 by making it dissolve in a chemical bath or when contact is brought about by electrostatic forces, by interrupting the electrostatic tension.

Moreover, the manipulator can be dissolved before collecting the film 4 on the target substrate. In this case, the thin film 4 can be contacted with the target substrate 22 either by its front face 10, or by its rear face 8.

The invention makes it possible to obtain a structure with a thin film on a substrate, where the film and substrate can have different thermal expansion coefficients by obviating, according to the invention, differential thermal expansion stresses, so as to obtain high quality thin films.

We claim:

1. A process for the production of a structure having a semiconductor thin film (4) adhering to a target substrate (24), comprising the following steps:

a) producing a first structure having a thin semiconductor film on a first substrate (2) to form a thin film-first substrate assembly, the thin film having a first free face (10) called the front face and a second face (8) called the rear face bonded to the first substrate by a first bonding energy $E_0$, and b) transferring the thin film (4) from the first substrate (2) to the target substrate (24), said transfer involving both a tearing of the thin film (4) from the first substrate (2) by application to the thin film-first substrate assembly tearing away forces able to overcome the first bonding energy and adhesive contacting of the thin film (4) with the target substrate (24), said transferring being accomplished by $b_1$) the adhesive contacting of a manipulator (12) with the first face (10) of the thin film (4), the adhesive contact being established with a second bonding energy $E_1$ exceeding the first bonding energy, $b_2$) separating of the thin film (4) and the first substrate (2) by tearing away the thin film (4) level with the second face (8) and the first substrate, and $b_3$) adhesive contacting of the second face of the thin film (4) with the target substrate (24) with a third bonding energy $E_2$ and separating of the thin film (4) from the manipulator (12).

2. The process according to claim 1, characterized in that the third bonding energy $E_2$ exceeds the second bonding energy $E_1$.

3. The process according to claim 1, characterized in that the first substrate (2) has an expansion coefficient substantially identical to the expansion coefficient of the thin film.

4. The process according to any one of the claims 1 and 3, characterized in that the tearing away forces comprise a tensile and/or shear force.

5. The process according to claim 1, characterized in that the thin film on the first substrate is obtained by:

an implantation of ions of rare gas or hydrogen in a supplementary substrate through its surface so as to generate a layer of gaseous microbubbles extending substantially in accordance with a plane defining in the supplementary substrate a surface thin film, the adhesive contacting of the thin film and the first substrate with the first bonding energy, and a heat treatment, which by a crystalline rearrangement effect and by a pressure effect in the gaseous microbubbles brings about a cleaving separating the film from the remainder of the supplementary substrate.

6. The process according to claim 1, characterized in that during step $b_3$), the separation of the thin film (4) and the manipulator takes place after the adhesive contacting of the film (4) with the target substrate (24).

7. The process according to claim 1, characterized in that during step $b_3$), the separation of the thin film (4) and the manipulator takes place prior to the adhesive contacting of the film (4) and the target substrate (24).

8. The process according to claim 7, characterized in that during step $b_3$), the manipulator and thin film are immersed in a chemical bath to dissolve the manipulator, the film being collected on the target substrate.

9. The process according to claim 7, characterized in that during step $b_3$), the thin film (4) is adhesively contacted with the target substrate (24) by its first or second face.

10. The process according to claim 1, characterized in that during step $b_1$), the adhesive contacting between the manipulator (12) and the thin film (4) is brought about by electrostatic forces and during step $b_3$), the separation of the film (4) and the manipulator (12) is obtained by eliminating said electrostatic forces.

11. The process according to claim 1, characterized in that the adhesive contact is obtained by a heat and/or pressure and/or chemical preparation treatment of the surfaces to be contacted.

12. The process according to claim 1, characterized in that the adhesive contact between the thin film and the manipulator is brought about with an adhesive.

13. The process according to claim 1, characterized in that the target substrate has a contacting surface above the surface of one of the first and second faces of the thin film.

14. The process according to claim 1, characterized in that the thin film (4) is a monocrystalline, semiconductor material film.

* * * * *